United States Patent [19]

Aketagawa

[11] Patent Number: 4,905,041
[45] Date of Patent: Feb. 27, 1990

[54] EXPOSURE APPARATUS

[75] Inventor: Masato Aketagawa, Yokohama, Japan

[73] Assignee: Canon Kabushiki Kaisha, Tokyo, Japan

[21] Appl. No.: 259,146

[22] Filed: Oct. 18, 1988

[30] Foreign Application Priority Data

Oct. 19, 1987 [JP] Japan .................. 62-264622

[51] Int. Cl.$^4$ ................................. G03B 27/42
[52] U.S. Cl. ........................... 355/53; 355/68; 353/122
[58] Field of Search ............... 355/53, 86, 68; 356/400, 401; 353/122; 364/184, 490

[56] References Cited

U.S. PATENT DOCUMENTS

| | | | |
|---|---|---|---|
| 4,553,834 | 11/1985 | Ayata et al. | 355/53 |
| 4,619,508 | 10/1986 | Shibuya et al. | 353/122 |
| 4,773,750 | 9/1988 | Bruning | 353/122 |

FOREIGN PATENT DOCUMENTS

| | | | |
|---|---|---|---|
| 61-129828 | 6/1986 | Japan | 355/53 |
| 63-114186 | 5/1988 | Japan . | |
| 63-192234 | 8/1988 | Japan . | |
| 63-213928 | 9/1988 | Japan | 355/53 |
| WO86/00427 | 1/1986 | PCT Int'l Appl. . | |

Primary Examiner—L. T. Hix
Assistant Examiner—D. Rutledge
Attorney, Agent, or Firm—Fitzpatrick, Cella, Harper & Scinto

[57] ABSTRACT

An exposure apparatus for exposing, to a pattern of a first object, a second object by use of light is disclosed. The apparatus includes a light source for supplying light having a predetermined wavelength, for exposing the second object to the pattern of the first object, a detecting device for detecting a change in the wavelength of the light from the light source, and a control device operable in response to a signal from the detecting device, to bring the second object substantially unexposed to the pattern of the first object.

14 Claims, 4 Drawing Sheets

EXPOSURE APPARATUS

FIELD OF THE INVENTION AND RELATED ART

This invention relates to an exposure apparatus and, more particularly, to an exposure apparatus which uses light such as a laser beam from an excimer laser, for example, to transfer a fine pattern of a reticle onto a wafer through a projection lens system.

In the field of photolithography and in order to ensure a higher degree of integration and further miniaturization of semiconductor devices, it is advantageous to use a deep ultraviolet light having a smaller diffraction effect as compared with that of a g-line light (of a wavelength 435 nm) from an Hg lamp. However, use of such a deep ultraviolet light in a projection exposure apparatus having a reduction projection lens system raises a problem of transmission factor of the projection lens system with respect to the deep ultraviolet light. At present, only silica ($SiO_2$) and calcium fluorite ($CaF_2$) are the optical glass materials that can transmit, with a good transmission factor, ultraviolet light of a wavelength not longer than 300 nm. With regard to calcium fluorite, however, there are problems in relation to the machining property and the homogeneousness, and for this reason, it is not easy to use this material. In consideration thereof, silica will be prevailing as the optical glass material used for such a projection lens system.

When a projection optical system is formed by a single glass material of silica, it is difficult to correct chromatic aberration satisfactorily. Therefore, if the light from a light source used has a substantial extension in the spectral bandwidth, the resolution cannot be improved to the extent desired despite that light in the deep UV region is used. In consideration of this, it is desirable to use a light source means that can provide a light having a narrow emission spectral bandwidth in the deep UV region.

Recently, excimer lasers have become attractive as a light source for lithography, because these lasers can provide high-power light in the deep UV region.

FIG. 1 shows the natural emission spectrum of a KrF excimer laser which is a typical example of excimer lasers. As illustrated, usually the spectral bandwidth of such an excimer laser is of an order of 0.5 nm. If, therefore, such an excimer laser is simply used as a light source in an exposure apparatus, there will occur a problem of the effect of chromatic aberration upon the pattern transfer performance of the apparatus. In consideration of this, when it is desired to use an excimer laser as a light source means in the exposure apparatus, it will be necessary to incorporate in the apparatus an arrangement that can narrow the spectral bandwidth of the excimer laser beam.

A projection exposure apparatus using a band-narrowed excimer laser beam and a projection lens consisting only of silica, has been proposed in Japanese Laid-Open Patent Application, Laid-Open No. Sho 61-129828 and PCT International Publication No. WO 86/00427.

SUMMARY OF THE INVENTION

The spectral bandwidth of an excimer laser beam can be narrowed by, for example, using a wavelength selecting element combination with a laser resonator so that only a particular wavelength component within the natural spectral bandwidth of the excimer laser beam (FIG. 1) is forcibly oscillated. However, it has been found that, when such a band-narrowed excimer laser is used as a light source means in an exposure apparatus, mechanical vibration applied to the wavelength selecting element (mounted inside or outside the laser resonator) during the exposure operation or any change in temperature of the wavelength selecting element may create a shift of the center wavelength of the band-narrowed excimer laser beam. If the center wavelength shifts, there occurs chromatic aberration within the projection lens system, with the result that the focus position and the projection magnification as determined by the projection optics shift accordingly. Additionally, there may occur deterioration in the wavefront aberration. As a consequence, the resolution of the projection lens system reduces, which leads to substantial deterioration of the pattern transfer performance of the apparatus.

The aforementioned PCT International Publication WO 86/00427 discloses an arrangement wherein the wavelength of a laser beam is detected and, based on the detection, a wavelength selecting element is adjusted so as to maintain a constant central wavelength of the laser beam. However, when it is difficult to adjust the wavelength selecting element so as to exactly compensate for the change in the wavelength of the laser beam or on an occasion when any disorder occurs in the wavelength selecting element or the laser resonator, itself, during exposure, the exposure has to be made with the shifted central wavelength.

If the projection exposure for exposing a wafer to a pattern of a reticle through a projection lens system, is made by use of a laser beam with its central wavelength shifted, the reticle pattern would be transferred onto the wafer with deteriorated transfer characteristics. Thus, there is a high possibility of production of defective semiconductor chips.

It is accordingly a primary object of the present invention to provide an exposure apparatus having an arrangement effective to prevent unsatisfactory pattern transfer onto a workpiece such as a wafer to thereby avoid production of defective semiconductor chips.

It is a second object of the present invention to provide a novel and unique wavelength monitoring system suitably usable in an exposure apparatus.

In accordance with one aspect of the present invention, to achieve the first object, there is provided an exposure apparatus for transferring a pattern of a first object such as an original onto a second object such as a workpiece, wherein there are provided a light source means for supplying light of a predetermined wavelength with which the second object is irradiated through the first object, detecting means for detecting the wavelength or any change in the wavelength of the light emitted from the light source means, and control means for controlling the exposure apparatus in accordance with an output signal from the detecting means, so as to substantially prohibit the second object from being further exposed to the first object.

According to another aspect of the present invention, there is provided an exposure apparatus for transferring a pattern of a first object onto a second object, wherein there are provided light source means for supplying light of a predetermined wavelength with which the second object is exposed to the first object, preventing means for preventing the second object from being exposed with the light from the light source means, driving means for driving the preventing means, a beam splitter disposed between the light source means and the preventing means, and detecting means for detecting the wavelength or any change in the wavelength of the light from the light source means, as directed by the beam splitter.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
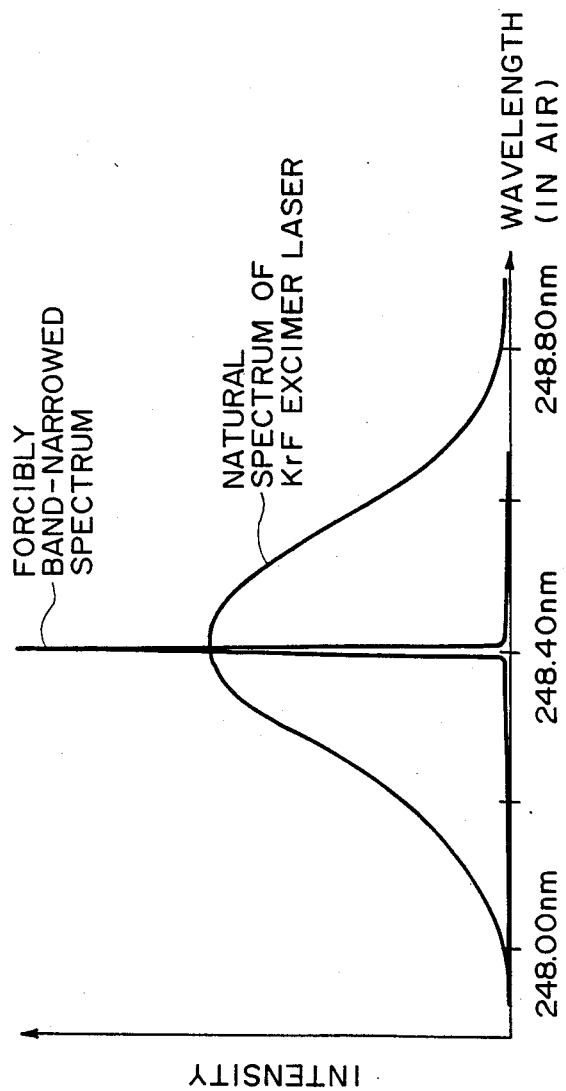
FIG. 1 is a graph showing a natural emission spectrum of a KrF excimer laser and a band-narrowed spectrum thereof.
Figure 2:
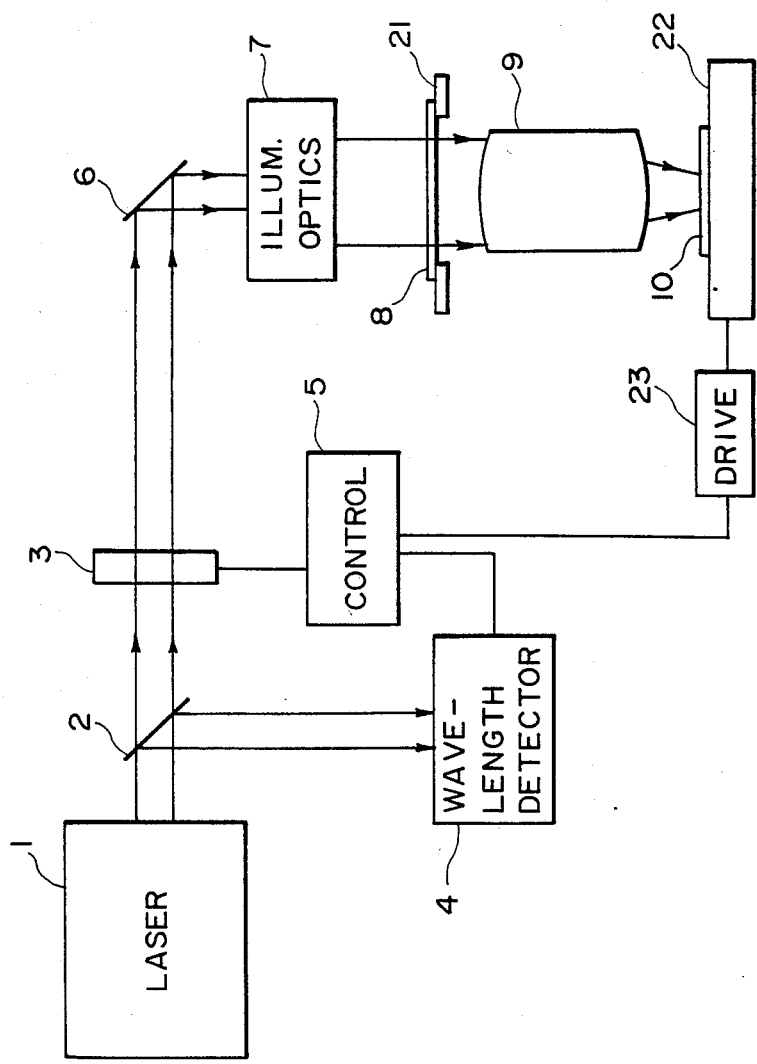
FIG. 2 is a schematic and diagrammatic view of an exposure apparatus according to one embodiment of the present invention.

Referring now to FIG. 2 which is a schematic and diagrammatic view of an exposure apparatus according to the present invention, the exposure apparatus includes a laser source 1 which is adapted to supply a band-narrowed pulsed laser beam having a particular central wavelength. As for this laser source 1, an arrangement such as disclosed in the aforementioned Japanese Laid-Open Patent Application or the aforementioned PCT International Publication, or any one of other suitable arrangements may be used. In the present embodiment, an injection-locking type highpower and band-narrowed laser device having plural laser resonators arrayed in series, is used. Each laser resonator comprises a KrF laser resonator. Thus, in the present embodiment, the laser source 1 can supply a KrF laser beam having a very narrow bandwidth, with a central wavelength of 248.40 nm.

In the present embodiment, as described, the laser source 1 is provided by a KrF laser and, with regard to the laser beam ($\lambda_0 = 248.40$ nm) to be provided by the KrF laser, a tolerable wavelength range ($\pm\Delta\lambda$) of "$\Delta\lambda = \pm 0.001$ nm" is set.

Light dividing means 2 comprises, in this embodiment, a half mirror disposed across the path of the laser beam emitted from the laser source 1. As illustrated, the half mirror 2 is inclined with respect to the optical axis of the exposure system. The half mirror 2 used in this embodiment is adapted to transmit a large portion of the laser beam and to reflect a small portion of the laser beam. The half mirror may be replaced by a small-size reflecting mirror extending partially into the path of the laser beam.

Openable and closable shutter device 3 is provided on the path of the laser beam passing through the half mirror 2. The shutter device 3 includes a shutter and a shutter driving means (both not shown), the latter being operable in response to a control signal to open/close the shutter. When the shutter is closed, the laser beam is intercepted such that advancement of the laser beam is blocked. As for such a shutter device 3, many types of devices are usable. For example, a mechanical arrangement having a light-blocking member which can be inserted into and retracted out of the path of a laser beam, or an arrangement in which a laser beam can be blocked by changing the optical characteristics of a light propagating medium such as an acousto-optic element, an electro-optic element or otherwise, may be used. As for such light-blocking member, acousto-optic element or electro-optic element, a material having sufficient resistivity to the laser beam irradiation should preferably be used to prevent deterioration in the function or changes in the optical characteristics due to the laser beam irradiation.

Since the shutter device 3 is a part of an exposure controlling means (in the exposure apparatus of the present embodiment) for controlling the exposure of a workpiece such as a wafer, it is sufficient that the shutter device 3 has at least a function for reducing the intensity of the laser beam to such a low level that cannot substantially sensitize a photoresist material applied to the workpiece. In this sense, the shutter device 3 is effective to selectively assure that the workpiece is substantially unexposed to the laser beam from the laser source 1.

Wavelength detecting device 4 receives the portion of the laser beam, as reflected by the half mirror 2, and detects the wavelength of the laser beam. The wavelength detecting device 4 may be of a type that uses a wavelength selecting element such as an etalon, grating or otherwise to detect the central wavelength of a laser beam, as disclosed in Japanese Laid-Open patent application, Laid-Open No. Sho. 63-213928. The result of the detection is transformed into an electric signal, and is outputted as the wavelength information.

Denoted at 5 is a control device to which signals from the wavelength detecting device 4 are applied along a signal line. Further, the shutter device 3 is electrically coupled to the control device 5 by a signal line, so that the shutter device 3 can be driven in response to a control signal from the control device 5.

Denoted at 6 is a total reflection mirror for bending or deflecting the path of the laser beam passing through the shutter device 3 when its shutter is opened. An ultraviolet-ray reflection film is formed on the reflecting surface of the total reflection mirror 6, so as to provide a reflection surface of high reflection factor.

Denoted at 7 is an illumination optical system for forming an illumination light by use of the laser beam reflected from the total reflection mirror 6; and at 8, a reticle having a fine circuit pattern which is placed on a movable reticle stage 21. The illumination optical system 7 is adapted to illuminate the reticle 8 with uniform illuminance distribution. The illumination optical system 7 may be of a known type, such as disclosed, for example, in the aforementioned PCT International Publication or U.S. Pat. No. 4,619,508.

Denoted at 9 is a projection lens system for projecting, in a reduced scale, the circuit pattern of the reticle 8 upon each or predetermined one of different shot areas on the wafer 10. In the present embodiment, the projection lens system 9 comprises a plurality of lens elements made of silica ($SiO_2$), and provides a reduction imaging optical system having an imaging magnification of 1:5 to 1:20.

The illumination optical system 7 is effective to form an image of a secondary light source, at the entrance pupil position of the projection lens system 9, and the wafer 10 is illuminated in the Kohler illumination fashion.

Further, in the present embodiment, all the light-transmissible optical elements such as a lens, disposed along the path of the laser beam from the laser source 1 to the reticle 8, are formed of silica. This ensures high illumination efficiency to the reticle 8.

The wafer 10 is placed on a wafer stage 22 which is adapted to be moved, by a wafer stage driving means 23, in the direction of the optical axis of the projection lens system 9 and in a plane perpendicular to that direction. The amount of movement of the wafer stage 22 in that plane can be monitored by use of a laser interferometer measuring system, not shown. Output signals from the laser interferometer measuring system are applied to the control device 5. The control device 5 is electrically connected to the wafer stage driving means 23 by way of a signal line, such that, on the basis of control signals from the control device 5, the wafer stage driving means 23 controls the movement of the wafer stage 22.

The laser beam from the laser source 1 goes by way of the half mirror 2, the shutter device 3 (when the shutter is opened), the total reflection mirror 6 and the illumination optical system 7, and illuminates the reticle 8. The circuit pattern of the thus illuminated reticle 8 is projected, through the projection lens system 9 and in a reduced scale, upon one shot area on the wafer 10. With the cooperation of stepwise movement of the wafer stage 22 controlled by the wafer stage driving means 23, the circuit pattern of the reticle is transferred onto each of the shot areas which are arrayed on the wafer 10.

In the present embodiment, the exposure apparatus is set so that the exposure (photoprinting) of each shot area is completed with several to several tens of pulses of the laser beam.

In the exposure operation, the wavelength detecting device 4 detects and monitors the central wavelength, in each pulse, of the laser beam from the laser source 1, and produces and applies, to the control device 5, the wavelength information (signal) representing the central wavelength of each laser beam pulse.

In the control device 5, such a wavelength range $\lambda_0 \pm \Delta\lambda$ (where $\lambda_0$ is a design central wavelength of the laser beam) in which the superior pattern transferring performance of the projection lens system 9 is assured, is preparatorily set. Thus, the control device 5 is operable to discriminate whether the central wavelength $\lambda$, for example, of the laser beam as represented by the wavelength information from the wavelength detecting device 4 is included in this wavelength range or, alternatively, whether the central wavelength is out of the wavelength range. If, as a result of the discrimination, the central wavelength $\lambda$ of the laser beam satisfies the relationship "$\lambda > \lambda_0 + \Delta\lambda$" or "$\lambda < \lambda_0 - \Delta\lambda$", namely when the wavelength $\lambda$ of the laser beam becomes out of the preset wavelength range during the exposure, the control device 5 supplies a control signal of "shutter closure" to the shutter device 3, so that the shutter device 3 closes the shutter and the laser beam is intercepted. By this, the advancement of the laser beam to the wafer 10 is blocked. Thus, the exposure of a current shot, being exposed, and the next shot to be exposed subsequently, is temporally stopped. Simultaneously therewith, the control device 5 supplies a control signal of "stage stop" to the wafer stage driving means 23, so that the wafer stage driving means stops the drive of the wafer stage 22 until a control signal of "stage go" is applied thereto. At this time, the light emitting operation of the laser source 1 may be stopped, if necessary.

If the central wavelength $\lambda$ of the laser light is discriminated as being included in the preset wavelength range, the control signal of "shutter closure" is not applied to the shutter device 3, so that the shutter is maintained open. Thus, the exposure of a predetermined shot or shots on the wafer 10 is executed.

By controlling the opening/closure of the shutter of the shutter device 3 in the described manner, it is possible to prevent the transfer of a circuit pattern onto the wafer 10 with a laser beam whose wavelength is deviated by a large amount from the design wavelength (or wavelength range) of the projection lens system 9 and, therefore, it is possible to sufficiently suppress continuous production of defective semiconductor chips.

In the present embodiment, the shutter device 3 is disposed in the optical path which is before or upstream of the total reflection mirror 6. The provision of such a shutter device between the half mirror 2 and the wafer 10 makes it possible to execute the following operation without exposing the wafer 10 to the laser beam:

That is, the detection of the wavelength $\lambda$ of the laser beam by the wavelength detector 4 can be continued after the shutter of the shutter device 3 is closed and, on the basis of the result of the detection or, alternatively, while monitoring the wavelength $\lambda$ at arbitrary moments, the laser source 1 can be adjusted by use of an adjusting device, not shown, so that a laser beam of a predetermined central wavelength $\lambda_0$ can be supplied from the laser source 1. When the oscillated wavelength is stabilized so that the wavelength $\lambda$ of the laser beam from the laser source 1 satisfies the relationship:

"$\lambda = \lambda_0$" or "$\lambda_0 - \Delta\lambda \leq \lambda \leq \lambda_0 + \Delta\lambda$", then the shutter of the shutter device 3 is opened and the exposure of the remaining shot areas on the wafer 10 is resumed.

Such a shot area on the wafer 10 which is being exposed to the circuit pattern when the deviation of the wavelength $\lambda$ of the laser beam out of the predetermined wavelength range is detected, may be memorized in a suitable memory means within the control device 5 as a defective shot area. Such a defective shot area may be excluded, out of the subjects of exposure, at the time of the pattern transfer in the succeeding exposure steps. Thus, a shot area next to this shot area is fed and brought to the position just underneath the projection lens system 9 (i.e. the image surface position) by the movement of the wafer stage 2 controlled by the wafer stage driving means 23. The thus placed shot area is then subjected to the alignment with respect to the reticle 8 and, after completion of the alignment, the shutter of the shutter device 3 is opened to execute the exposure.

In the embodiment described above, the shutter is closed when the wavelength of one laser pulse is deviated out of a predetermined range. However, the control of the shutter device 3 is not limited to the described manner. For example, when a relatively large number of laser pulses (e.g. several hundreds - several tens of hundreds of pulses) are required for the exposure of each shot area on the wafer 10, the shutter device 3 may be controlled (to close the shutter thereof) when deviation of the wavelengths of a plurality of consecutive laser pulses, out of the predetermined range, is detected.

If, during exposure of the last shot area on the wafer, the deviation of the wavelength of a laser pulse or pulses from the predetermined range is detected, the actuation of the laser source 1 may be temporarily stopped in place of closing the shutter of the shutter device 3.

Figure 3:
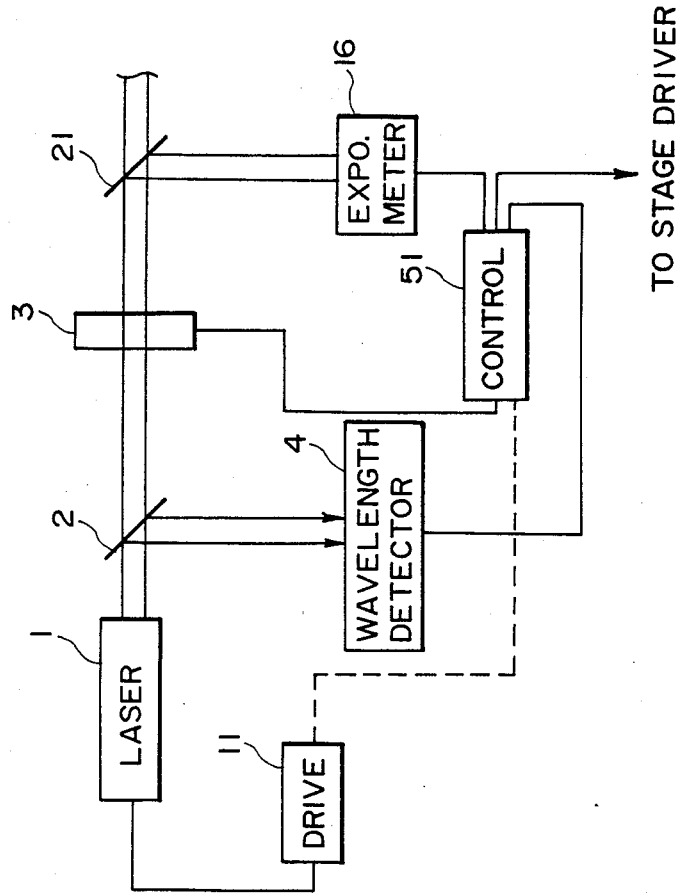
FIGS. 3 and 4 are diagrammatic views, respectively, each showing a portion of an exposure apparatus according to another embodiment of the present invention.

FIG. 3 is a fragmentary and schematic illustration showing an exposure apparatus according to another embodiment of the present invention. Although the structural portion of the FIG. 2 embodiment, including the total reflection mirror 6 and those elements following the mirror, is not illustrated in FIG. 3, the FIG. 3 embodiment includes a similar structural portion.

In FIG. 3, same reference numerals as those in FIG. 2 are assigned to the same or corresponding elements, and description of those elements is omitted here for simplicity. The remaining portion will be described below.

Reference numeral 11 denotes a driving device for controllably driving a laser source 1. More specifically, in accordance with signals from the driving device 11, the actuation and de-actuation of the oscillation of the laser source 1 is controlled. Denoted at 21 is a second half mirror disposed in the path of the laser beam. The half mirror 21 is effective to transmit a large portion of the laser beam and to reflect a small portion thereof. Denoted at 16 is an exposure meter which receives the laser beam reflected from the second half mirror 21 and which is used for the exposure control when a wafer 10 is exposed. Denoted at 51 is a control device which is electrically connected to each of a wavelength detecting device 4, a shutter device 3, the exposure meter 16 and a stage driver 23 by way of respective signal lines.

In the present embodiment, the control device 51 is operable on the basis of wavelength information supplied from the wavelength detecting device 4, similarly to the foregoing embodiment, to control opening/closing of a shutter of the shutter device 3. Also, it is operable on the basis of a signal from the exposure meter 16 to control the opening/closing motion of the shutter of the shutter device 3, for the exposure control purpose.

In the control device 51, there are provided a first discriminating means operable to discriminate whether the central wavelength λ of the laser beam is included within a predetermined wavelength range and a second discriminating means operable to discriminate whether the amount of exposure has reached a predetermined value. On the basis of the results of discriminations by these discriminating means, the common shutter device 3 can be driven.

An ordinary integrating exposure meter may be used as the exposure meter 16. In the present embodiment, however, the fact that the laser beam from the laser source 1 is a pulsed laser beam, is utilized and the exposure meter 16 is arranged to count the number of pulses of the laser beam emitted from the laser source 1. Thus, the output signal of the exposure meter 16 represents the number of pulses, as counted, and the control device 51 compares the count of pulses with a predetermined pulse number having been preparatorily set in the control device 51.

In the first and second embodiments described hereinbefore, the shutter device 3 is used to prevent the laser beam from reaching the reticle 10 as the wavelength of the laser beam changes. However, as denoted by a broken line in FIG. 3, the control device 51 may be coupled to the driving device 11 for the laser source 1 by a signal line so that, as the wavelength changes, a stop signal may be applied to the driving device 11 from the control device 51 to stop the drive of the laser device 1.

Figure 4:
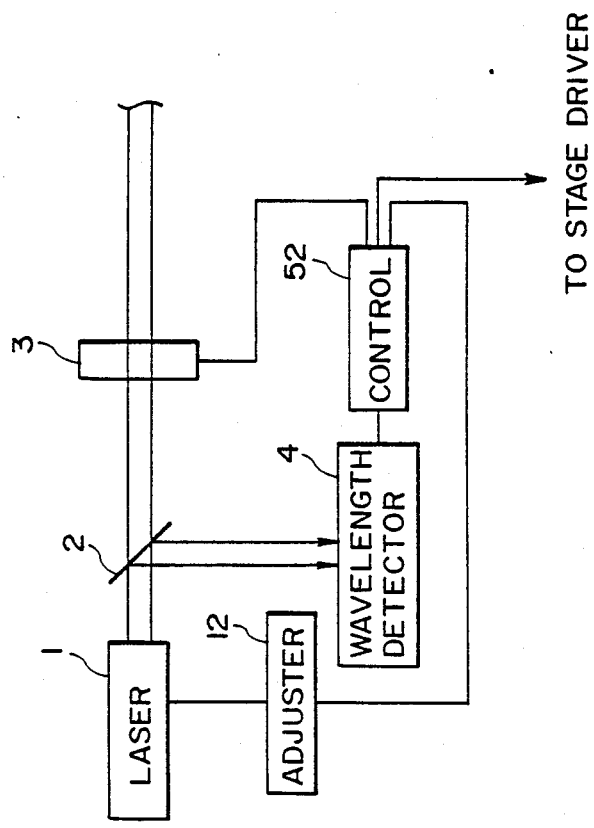

FIG. 4 is a fragmentary and schematic illustration showing an exposure apparatus according to a further embodiment of the present invention.

Although, like FIG. 3, a later part of the structure is not shown in FIG. 4, the FIG. 4 embodiment includes a similar structural portion as in the FIG. 2 example. Also, the same reference numerals as in the FIG. 2 example are assigned to the same or corresponding elements, and description of those elements is omitted here for simplicity.

In FIG. 4, reference numeral 12 denotes an adjusting device which is operable to adjust the inclination and/or position of a wavelength selecting element, not shown, which is provided in the laser source 1 for the spectral-bandwidth narrowing purpose. Details of the structure and function of such an adjusting device 12 are known in the art, such as disclosed in the aforementioned PCT International Publication WO 86/00427. Since the adjusting device itself is not directly concerned with the present invention, description thereof will be omitted here for simplicity.

Denoted at 52 is a control device which has a similar function as of that of the control device 5 or 51 described hereinbefore. The control device 52 is electrically connected to a shutter device 3, the adjusting device 12 and a stage driver 23 by way of respective signal lines.

In the present embodiment, the control device 52 is adapted to execute two types of discriminations on the basis of wavelength information supplied from a wavelength detecting device 4.

The first discrimination is such as discriminating whether the central wavelength λ of the laser beam is within a predetermined wavelength range. On the basis of the result of this discrimination, the shutter device 3 is driven. Namely, when the central wavelength λ varies out of the predetermined range, a control signal of "shutter closure" is applied to the shutter device 3, whereby the shutter thereof is closed.

If, on the other hand, the central wavelength λ of the laser beam is included in the predetermined wavelength range, the shutter of the shutter device 3 is maintained opened. Additionally, the detected central wavelength λ of the laser beam is compared with a design central wavelength $\lambda_0$ (a central wavelength to be used in the exposure apparatus) of the projection lens system 9. At this time, any difference between the actual wavelength λ of the laser beam and the design wavelength $\lambda_0$ is detected, and such a signal as representing the amount of adjustment of the position, for example, of the wavelength selecting element for the laser source 1 is applied to the adjusting device 12, so that the laser source 1 produces a laser beam of the wavelength $\lambda_0$. In accordance with the applied signal, the adjusting device 12 adjusts the position, for example, of the wavelength selecting element so that the central wavelength of the laser beam is stabilized at the value of $\lambda_0$.

It is a possible alternative that two different wavelength ranges "$\lambda_0 \pm \Delta\lambda$" and "$\lambda_0 \pm \Delta\lambda'$" (where $\Delta\lambda' < \Delta\lambda$) are set in the control device 52, and the exposure is continued without actuating the shutter device 3 and the adjusting device 12 when the detected central wavelength λ of the laser beam is included in the range "$\lambda_0 \pm \Delta\lambda'$"; the adjusting device 12 is actuated in accordance with the value of the detected central wavelength λ on an occasion when the detected central wavelength λ is out of the range "$\lambda_0 \pm \Delta\lambda'$" but is included in the range "$\lambda_0 \pm \Delta\lambda$", so that the wavelength of the laser beam comes into the range "$\lambda_0 \pm \Delta\lambda'''$"; and the shutter device 3 is actuated to close the shutter to thereby stop the exposure on an occasion when the central wavelength $\lambda$ comes out of the range "$\lambda_0 \pm \Delta\lambda''$".

In the present embodiment, as described, the shutter device 3 and the adjusting device 12 are selectively controlled in accordance with the amount of change or shift of the wavelength of the laser beam, to assure correct exposure control for a wafer 10.

In accordance with the present invention, as has hitherto been described, any change in the wavelength of a laser beam emitted from a laser source is detected and, if the central wavelength of the laser beam is deviated from a predetermined wavelength range, the exposure of a workpiece such as a wafer with the laser beam is prevented. Therefore, it is possible to avoid the pattern transfer onto the workpiece with inferior pattern transfer performance and, therefore, it is possible to avoid production of defective semiconductor chips.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing, to a pattern of a first object, a second object by use of a radiation beam, said apparatus comprising:
   illuminating means for illuminating the first object with a radiation beam having a predetermined wavelength;
   detecting means for detecting a change in the wavelength of the radiation beam irradiating the first object; and
   control means operable in response to a signal from said detecting means, to cause the second object to be substantially unexposed to the pattern of the first object.

2. An apparatus according to claim 1, wherein said illuminating means comprises an excimer laser.

3. An apparatus according to claim 1, wherein said apparatus further comprises an openable and closable radiation-blocking member provided in the path of the radiation beam and wherein said control means controls the opening and closing of said radiation-blocking member.

4. An apparatus according to claim 1, wherein said illuminating means comprises a light source and driving means for driving said illuminating means and wherein said control means controls the drive of said illuminating means by said driving means.

5. A projection exposure apparatus for projecting a pattern of a first object upon a second object through a projection lens system to expose the second object to the pattern of the first object, said apparatus comprising:
   a first stage for supporting the first object;
   a second stage for supporting the second object, said second stage being movable;
   illumination means for illuminating the first object with a light having a predetermined wavelength, so that the second object is exposed to the pattern of the first object;
   detecting means for detecting a change in the wavelength of the light irradiating the second object; and
   control means operable in response to a signal from said detecting means, to control said apparatus so as to cause the second object to be substantially unexposed to the pattern of the first object.

6. An apparatus according to claim 5, wherein said control means is operable in response to the signal from said detecting means to control the movement of said second stage.

7. An apparatus according to claim 5, wherein said illumination means comprises an excimer laser and an optical system for directing a laser pulse from said laser to the first object.

8. An apparatus according to claim 7, wherein said apparatus further comprises openable and closable light-blocking means provided in the path of the laser pulse and wherein said control means controls the opening and closing of said light-blocking means.

9. An apparatus according to claim 8, wherein said apparatus further comprises adjusting means for adjusting the oscillation wavelength of said excimer laser and wherein said control means operates in response to a signal from said detecting means to selectively actuate said adjusting means and said light-blocking means.

10. An apparatus according to claim 8, wherein said apparatus further comprises means for monitoring the amount of exposure by the laser pulse and wherein said control means operates in response to a signal from said monitoring means to control said lightblocking means.

11. An apparatus according to claim 8, wherein said detecting means receives the laser pulse by way of a beam splitter provided in the path of the laser pulse, to detect the change in the wavelength thereof and wherein said beam splitter is provided between said laser and said light-blocking means.

12. An exposure apparatus for exposing an object, said apparatus comprising:
   a radiation source for emitting a radiation beam having a predetermined wavelength;
   a radiation system for directing the radiation beam from said radiation source to the object for exposure thereof;
   openable and closable beam-blocking means provided in the path of the radiation beam;
   a beam splitter disposed in the path of the radiation beam between said radiation source and said beam-blocking means;
   detecting means disposed to receive a portion of the radiation beam from said beam splitter, for detecting a change in the wavelength of the radiation beam during exposure; and
   control means for controlling said beam-blocking means in response to a signal from said detecting means, to cause the object to be substantially unexposed to the radiation beam.

13. An exposure apparatus for exposing an object, said apparatus comprising:
   means for directing a radiation beam having a predetermined wavelength to the object;
   means for detecting a change in the wavelength of the radiation beam irradiating the object; and
   control means operable in response to a signal from said detecting means to control the apparatus so as to cause the object to be substantially unexposed to the radiation beam.

14. A projection exposure apparatus for projecting a pattern of a reticle upon different shot areas on a wafer in a predetermined order, by use of a projection lens system, said apparatus comprising:

a reticle stage for supporting the reticle;
a wafer stage for supporting the wafer, said wafer stage being movable in a plane perpendicular to an optical axis of the projection lens system;
illuminating means for illuminating the reticle with light having a predetermined wavelength;
detecting means for detecting a change in the wavelength of the light irradiating the reticle; and control means operable in response to a signal from said detecting means, to control said apparatus so as to cause the wafer to be substantially unexposed to the pattern of the reticle, said control means having a memory for memorizing a shot area on the wafer having been exposed to the pattern of the reticle with the light whose wavelength has been changed.

* * * * *

UNITED STATES PATENT AND TRADEMARK OFFICE
CERTIFICATE OF CORRECTION

PATENT NO. : 4,905,041
DATED : February 27, 1990
INVENTOR(S) : Masato Aketagawa

It is certified that error appears in the above-identified patent and that said Letters Patent is hereby corrected as shown below:

COLUMN 5

Line 62, "temporally" should read --temporarily--.

COLUMN 10

Line 28, "lightblocking" should read --light-blocking--.

Signed and Sealed this

Eighth Day of September, 1992

Attest:

DOUGLAS B. COMER

Attesting Officer

Acting Commissioner of Patents and Trademarks